(12) United States Patent
Takahashi et al.

(10) Patent No.: US 7,399,582 B2
(45) Date of Patent: Jul. 15, 2008

(54) MATERIAL FOR FORMING FINE PATTERN AND METHOD FOR FORMING FINE PATTERN USING THE SAME

(75) Inventors: Kiyohisa Takahashi, Kakegawa (JP); Yusuke Takano, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/565,113

(22) PCT Filed: Jun. 4, 2004

(86) PCT No.: PCT/JP2004/007829

§ 371 (c)(1), (2), (4) Date: Jan. 17, 2006

(87) PCT Pub. No.: WO2005/008340

PCT Pub. Date: Jan. 27, 2005

(65) Prior Publication Data

US 2006/0183218 A1    Aug. 17, 2006

(30) Foreign Application Priority Data

Jul. 17, 2003    (JP) ............................... 2003-276137

(51) Int. Cl.
*G03F 7/40* (2006.01)
*H01L 21/027* (2006.01)

(52) U.S. Cl. .................. 430/331; 430/328; 430/329; 430/330; 430/315

(58) Field of Classification Search ........................ None
See application file for complete search history.

(56) References Cited

U.S. PATENT DOCUMENTS

| | | | | |
|---|---|---|---|---|
| 3,615,458 A | * | 10/1971 | Dykstra | 430/274.1 |
| 3,725,061 A | * | 4/1973 | Verhille et al. | 430/87 |
| 5,858,620 A | | 1/1999 | Ishibashi et al. | |
| 5,968,712 A | * | 10/1999 | Thackeray et al. | 430/326 |
| 6,319,853 B1 | | 11/2001 | Ishibashi et al. | |
| 6,555,607 B1 | | 4/2003 | Kanda et al. | |
| 6,902,862 B2 | * | 6/2005 | Takahashi et al. | 430/270.1 |
| 7,033,735 B2 | * | 4/2006 | Ho et al. | 430/312 |
| 2002/0037946 A1 | * | 3/2002 | Isozaki et al. | 523/128 |
| 2003/0091732 A1 | | 5/2003 | Kanda | |
| 2003/0113663 A1 | | 6/2003 | Kobayashi | |
| 2003/0194639 A1 | * | 10/2003 | Miya et al. | 430/270.1 |
| 2004/0072098 A1 | * | 4/2004 | Kozawa et al. | 430/270.1 |
| 2004/0121259 A1 | * | 6/2004 | Kozawa et al. | 430/270.1 |
| 2005/0031987 A1 | * | 2/2005 | Nozaki et al. | 430/270.1 |
| 2006/0088788 A1 | | 4/2006 | Kudo et al. | |

(Continued)

FOREIGN PATENT DOCUMENTS

EP    1 223 470    7/2002

(Continued)

OTHER PUBLICATIONS

Duncalf et al "Light-Sensitized Crosslinking of Polyvinyl Alcohol by Chrmium Compounds", Journal of Applied Polymer Science, col. 8, pp. 1763-1776, year -1964 (no month given).*

(Continued)

*Primary Examiner*—Cynthia Hamilton
(74) *Attorney, Agent, or Firm*—Sangya Jain

(57) ABSTRACT

In the method wherein a resist pattern is miniaturized effectively by applying a fine pattern forming material, the fine pattern forming material used for providing with a cured coated layer pattern, wherein development defects are reduced by water development is offered, wherein the fine pattern forming material comprises a water-soluble resin, a water-soluble crosslinking agent and water or a mixed solution consisting of water and a water-soluble organic solvent, and further comprises an amine compound.

12 Claims, 1 Drawing Sheet

U.S. PATENT DOCUMENTS

2006/0211814 A1    9/2006    Nishikawa et al.
2006/0258809 A1*  11/2006  Sugeta et al. ............... 525/206
2007/0059644 A1    3/2007    Takahashi et al.

FOREIGN PATENT DOCUMENTS

| | | | |
|---|---|---|---|
| EP | 1 223 470 A1 | | 7/2002 |
| EP | 1 398 671 | | 3/2004 |
| EP | 1398671 A1 | * | 3/2004 |
| EP | 1 757 989 A1 | | 2/2007 |
| JP | 5-241348 | | 9/1993 |
| JP | 6-250379 | | 9/1994 |
| JP | 9-235318 | | 9/1997 |
| JP | 10-73927 | | 9/1998 |
| JP | 11-204399 | | 7/1999 |
| JP | 2001-109165 | | 4/2001 |
| JP | 2002-49161 | | 2/2002 |
| JP | 2004-77951 | | 3/2004 |

OTHER PUBLICATIONS

U.S. Appl. No. 11/660,199, filed Feb. 17, 2007, Kiyohisa et al.
English Language Abstract of JP 5-241348. Copyright Date 2003 No Month Given.
English Language Abstract of JP 6-250379. Copyright Date 2003 No Month Given.
English Language Abstract of JP 9-235318. Copyright Date 2003 No Month Given.
English Language Abstract of 10-73927. Copy Generated May 8, 2006.
English Language Abstract of JP 11-204399. Copyright 2003 No Month.
English Language Abstract of JP 2001-109165. Copyright 2003 No Month.
English Language Abstract of JP 2002-49161. Copyright 2003 No Month.
English Language Abstract of JP 2004-77951. Copy Generated May 8, 2006.
Machine Language English Translation from JPO of JP 5-241346. Generated May 8, 2006.
Machine Language English Translation from JPO of JP 6-250379. Generated May 8, 2006.
Machine Language English Translation from JPO of JP 9-235318. Generated May 8, 2006.
Machine Language English Translation from JPO of JP 10-73927. Generated May 8, 2006.
Machine Language English Translation from JPO of JP 11-204399. Generated May 8, 2006.
Machine Language English Translation from JPO of JP 2001-109165. Generated May 8, 2006.
Machine Language English Translation from JPO of JP 2002-49161. Generated May 8, 2006.
Machine Language English Translation from JPO of JP 2004-77951. Generated May 8, 2006.

* cited by examiner

MATERIAL FOR FORMING FINE PATTERN AND METHOD FOR FORMING FINE PATTERN USING THE SAME

TECHNICAL FIELD

The present invention relates to a fine pattern forming material, wherein a development by water comes to be possible without using a developer for an exclusive use by reducing a separation size between a resist pattern and a resist pattern or a pattern hole aperture size which is already formed upon forming a resist pattern in a semiconductor process as well as a finer pattern can be formed, and to a pattern forming method using the fine pattern forming material.

BACKGROUND ART

In various fields including manufacturing a semiconductor device such as LSI, forming a liquid crystal display face such as LCD panels, and manufacturing circuit substrates for a thermal head and so on, a formation of resist patterns on substrates is conducted for a formation of fine elements or for fine processing. Formation of these resist patterns employs a so-called photolithographic method which involves a light exposure of a photosensitive resin composition by a selective irradiation with actinic rays such as ultraviolet rays, deep ultraviolet rays, an excimer laser, X-rays or electron beams and a subsequent development treatment thereof. In this photolithographic method, a positive- or negative-working photosensitive resin composition is used to form resist patterns.

As semiconductor devices and so on have been highly integrated in recent years, a line width of a wire and a gap between separated wires required in these manufacturing processes come to be further finer, and in coping therewith, light-exposure devices utilizing a short-wavelength light source such as g-line, i-line, an excimer laser and so on are used, and a phase-shift mask and so on are also used in light exposure. In the conventional photolithographic technology using light exposure, however, a formation of fine resist patterns exceeding the limit of wavelength is difficult and the light-exposure devices for short wavelength and the devices using a phase-shift mask are expensive. Accordingly, methods wherein resist patterns are formed from a known positive- or negative-working photosensitive resin composition by a known pattern-forming device without using the expensive devices and the formed resist patterns are effectively made fine have been extensively studied. As one method of making resist patterns fine effectively, there is proposed a method of forming fine resist patterns below the limit of resolution effectively as follows. That is, patterns are formed from a known photosensitive resin composition such as a chemically amplified photoresist by a conventional method, a coated layer comprising a fine pattern forming material containing a water-soluble resin is applied onto the formed resist patterns, the resist is heated and/or exposed to light to permit an acid formed in the resist or an acid present in the resist diffusing into the coated layer, and by this diffused acid, the coated layer in the vicinity of the resist is crosslinked and cured. Thereafter the non-crosslinked coated layer is removed to thicken the resist patterns. As a result, the width of a gap between a resist pattern and a resist pattern is decreased, the resist patterns are made fine by reducing the separation size of the resist patterns or the size of a hole opening, and the fine resist patterns with the limit of resolution or less are effectively formed (see, for example, JP 5-241348 A, JP 6-250379 A, JP 10-73927 A, and JP 11-204399 A).

At present, upon effectively forming a fine resist pattern having a size of a resolution limit or less after a coated layer is formed by applying a fine pattern forming material on a resist pattern, a heating and/or an exposure to light treatment is carried out and a development is made, in order to remove the above uncrosslinked layer a developer for exclusive use (see JP2002-49161A, for example) or a developer comprising a mixed solution of water and a water-soluble organic solvent is being applied. This is because of incomplete removal of uncrosslinked area of the coated layer by a development only with water due to poor solubility of a fine pattern forming material so far known in water, generating a residue of dissolution to cause a lot of development defects. Because of this, a fine pattern formation by a development only by water is difficult from the view point of development defects at present.

Problems to be Solved by the Invention

Accordingly an objective of the present invention is to offer a fine pattern forming material, wherein the problems in the past are improved, that is a solubility in water of an uncrosslinked coated layer is raised, a development only by water can be carried out, less development defects are brought by the development only by water and no practical problems are caused.

And other objective of the present invention is to offer a fine pattern forming method, whereby a resist pattern can be formed, wherein less development defects are brought by a development only by water and no practical problems are caused in the method wherein a coated layer is formed on a resist pattern by applying the fine pattern forming material on the resist pattern, a crosslinked layer is formed in the vicinity of the resist pattern by diffusing an acid generated by heating, etc. into the coated layer to form a crosslinked layer in the vicinity of the resist pattern and an uncrosslinked layer is removed by a development.

Measures to Solve the Problems

As a result of eager studies and examinations, the present inventors found that in the fine pattern forming material comprising a water-soluble resin, a water-soluble crosslinking agent and water or mixed solvent of water and a water-soluble organic solvent, the fine pattern forming material comes to be developable by water by incorporating an amine compound into the fine pattern forming material and then the above theme can be solved, the theme can be more accurately solved by applying particular materials as a water-soluble resin, a water-soluble crosslinking agent and an amine compound, and further the above theme can be solved more accurately by selection of the amine compound and a coatability of the fine pattern forming material can be raised by incorporating a surfactant to reach to the present invention.

It means that the present invention relates to the fine pattern forming material which is characterized in comprising a water-soluble resin, a water-soluble crosslinking agent and water or a mixed solvent of water and a water-soluble organic solvent and that the above-described fine pattern forming material comprises an amine compound which is at least one selected from the group consisting of a primary amine compound consisting of hydrazine, urea, amino acid, a glucosamine derivative, a polyallylamine derivative, an amino group of which is at least one selected from the group consisting of an alkyloxycarbonyl group, an aryloxycarbonyl group and an alkylcarbonyl group and is partially protected in the above fine pattern forming material, and a quaternary amine compound thereof consisting of dimethyl ammonium salt, trimethyl ammonium salt, tetramethyl ammonium salt, dimethyl ethyl benzyl ammonium salt or N-methylpyridinium salt of the above primary amine compounds and that pH value of the above fine pattern forming material exceeds 7.0.

And also the present invention relates to a fine pattern forming material, wherein the water-soluble resin is at least one selected from the group consisting of a polyvinylalcohol derivative, a polyvinylpyrrolidone derivative and a polyacrylic acid derivative, the water-soluble crosslinking agent is at least one selected from the group consisting of a melamine derivative and a urea derivative.

Further the present invention relates to the fine pattern forming material, wherein the amine compound described before is a polyallylamine derivative and the molecular weight thereof is 1,000 to 10,000 in any one of the above fine pattern forming materials.

And also the present invention relates to a fine pattern forming material, further containing a surfactant in any one of the above fine pattern forming material.

And also the present invention relates to a fine pattern forming material, wherein the surfactant is at least one selected from the group consisting of an anionic surfactant consisting of alkylsulfonate, alkylbenzene sulfonic acid and alkylbenzenesulfonate, a cationic surfactant consisting of laurylpyridinium chloride and laurylmethylammonium chloride, a nonionic surfactant consisting of polyoxyethylene octylether, polyoxyethylene laurylether and polyoxyethylene acetylenic glycolether in the above fine pattern forming material.

And the present invention also relates to a fine pattern forming method which is characterized in comprising a resist pattern forming step comprising a photoresist on a substrate, a step wherein a coating layer is formed by applying any of the before-described fine pattern forming material, a step wherein the area neighboring to a resist pattern is crosslinked and/or cured by heating the before-described resist pattern and the before-described coated layer and by a diffusion of an acid from the resist pattern and a step wherein the before-described coated layer is developed by water after heating.

Effects of the invention

In the present invention, a water-soluble fine pattern forming material can be obtained by incorporating an amine compound into the fine pattern forming material. By using this water-soluble fine pattern forming material, a coated layer is formed on a resist pattern generating an acid by heating, etc., the coated layer in the vicinity of the resist pattern is crosslinked or cured by heating, is developed and the number of development defects are also reduced by water development to be able to form a pattern without problems in a practical use. And also by further incorporating a surfactant into the fine pattern forming material, the fine pattern forming material wherein a minimum coating amount is reduced and a pattern forming method using the same can be offered. By the fine pattern forming material of the present invention and the fine pattern forming method applying this fine pattern forming material, in a fine processing for manufacturing electronic parts such as a semiconductor, etc. or a three-dimensional fine structured article, a pattern having a size of a limit resolution of an exposure to light or less can be formed in accordance with a design rule as designed in high accuracy, high-through-put and inexpensively.

Figure 1:
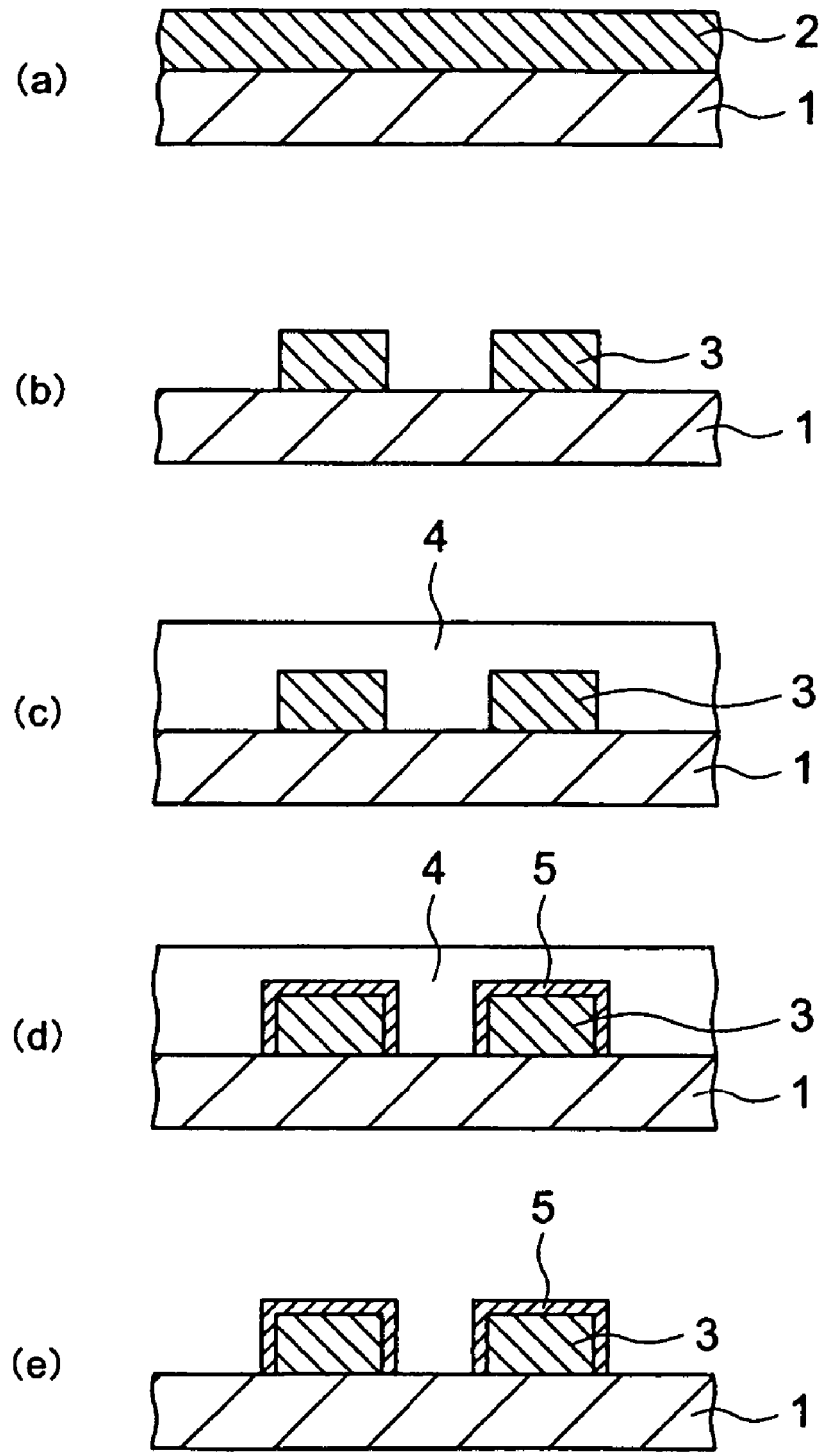
FIG. 1 shows a step of thickening resist patterns using a fine pattern forming material and reducing the size of a gap between a resist pattern and a resist pattern to make the resist patterns fine effectively.

EXPLANATION OF REFERENCE NUMERAL 1 a substrate
2 a photoresist layer
3 a resist pattern
4 a coating film of fine pattern forming material
5 a developer-insoluble crosslinked and cured layer Best Mode for Carrying out the invention The present invention is explained further in detail below.

The present invention improved the fine pattern forming materials so far publicly known and made it possible to develop only by water. In the fine pattern forming technologies so far publicly known, as referred to JP 10-73927 A, for example, the method is taken, wherein a water-soluble resin and a water-soluble crosslinking agent are used as main components of a fine pattern forming material, dissolving these components in water or a mixed solvent of water and a water-soluble organic solvent to form a fine pattern forming material, the fine pattern forming material obtained thereby is applied on a first resist layer supplying an acid and a coated layer made of the fine pattern forming material is formed on the resist pattern, thereafter a crosslinking reaction is caused by an acid generated from the first resist layer by heating, etc. to form a crosslinked film on the coated layer and an uncrosslinked area is removed by development using a developer for an exclusive use. Upon development, the reason why the developer for an exclusive use is applied is that a lot of development defects are brought by development only by water due to a poor solubility of the uncrosslinked area of the coated layer in water as mentioned before and then the solubility of the uncrosslinked area in the developer is raised by adding a surfactant or a water-soluble organic solvent and a formation of a pattern with less development defects were carried out.

In the present invention, by adding an amine compound into a fine pattern forming material, it acts as a dissolution promoter, thereby a solubility of an uncrosslinked area is raised and thus a development of a coated layer only by water was made possible. As amine compounds, a primary amine compound and a quarternary amine compound are preferable since a dissolution promotion effect is significant when applying a primary amine compound or a quarternary amine compound as an amine compound, a solubility of an uncrosslinked area into water is improved and thus an improvement of development defects can be observed more.

Amine compounds used in the fine pattern forming material of the present invention can be illustrated with a primary amine compound consisting of hydrazine, urea, amino acid, a glucosamine derivative, a polyallylamine derivative, and a quarternary amine compound thereof consisting of dimethyl ammonium salt, trimethyl ammonium salt, tetramethyl ammonium salt, dimethyl ethyl benzyl ammonium salt or N-methylpyridinium salt of the above primary amine compounds. Amongst these amine compounds, a polyallylamine derivative is preferable. The glucosamine derivative can be illustrated with glucosamine and an acetic acid salt thereof, etc. A polyallylamine derivative is ones wherein an amino group of the allylamine is partially protected with an alkyloxycarbonyl group, an aryloxycarbonyl group or an alkylcarbonyl group in a polymer of allylamine or in a copolymer between allylamine and other monomer. An introduction of the above protecting group into allylamine can be carried out in the publicly known methods (for example, JP 9-235318 A). The objective to protect polyallylamine partially with a protecting group is that a basic property of the fine pattern forming material arising from polyallylamine can be controlled and a problem can be inhibited that an acid generated from a resist layer is excessively captured to decrease the quantity of effective acids required for crosslinking a resist coated layer. The above other monomer can be illustrated with N-vinyl-2-pyrrolidone, acrylic acid, etc. The amount of allylamine in the copolymer is preferably 50 mol % or more. Weight average molecular weight of the polyallylamine derivative is preferably 1,000 to 10,000, more preferably 3,000 to 7,000. If the weight average molecular weight of the polyallylamine derivative is less than 1,000, there arises a problem that a cross section form is deteriorated. If exceeding 10,000, there arises a problem that a solubility of polyallylamine derivative comes to be worse. The particularly preferable polyallylamine derivative is the polyallylamine derivative represented by the following general formula (1).

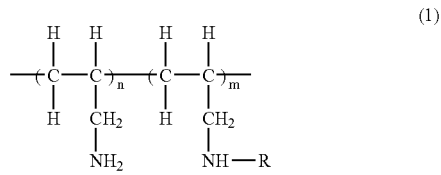

(wherein R represents an alkyloxycarbonyl group, aryloxycarbonyl group or alkylcarbonyl group, n and m represent a ratio of each recurring unit and n+m=100.)

In the above general formula (1), as an alkyl group in alkyloxycarbonyl group, aryloxycarbonyl group or alkyl carbonyl group, an alkyl group having carbon number 1 to 3 is preferable. An n:m ratio is from 20:80 to 80:20, preferably from 30:70 to 70:30. If n is less than 20, it is preferred since a problem is taken place that a solubility promotion effect is likely to decrease. If n exceeds 80, it is not preferred since a problem is taken place that a basic property becomes to be too strong, polyallylamine traps an acid generated from a resist layer and an effective volume of acid is likely to decrease.

In the fine pattern forming material, a water-soluble resin, a water-soluble crosslinking agent and a solvent are contained besides the above amine compound. Any one of water-soluble resins can be applied as far as they are soluble in water or a mixed solution of water and a water-soluble organic solvent. These water-soluble resins can be illustrated with a polyvinyl alcohol derivative, a polyvinylpyrrolidone derivative, a polyacrylic acid derivative, etc. The polyvinyl alcohol derivative in these water-soluble resins are illustrated typically with a modified polyvinyl alcohol obtained by modifying a hydroxyl group of polyvinyl alcohol with a protecting group such as an acetyl group, an acetal group, a formal group, a butyral group and so on. The reaction of the hydroxyl group of polyvinyl alcohol for protection with an acetyl group, acetal group, formal group, butyral group and so on can be carried out by known methods described in, for example, JP 10-158328 A. A polyvinylpyrrolidone derivative can be illustrated with a vinyl pyrrolidone-vinyl acetate copolymer, a vinyl pyrrolidone-vinyl alcohol copolymer, a vinyl pyrrolidone-vinyl melamine copolymer, etc. A polyacrylic acid derivative can be illustrated with polyacrylic acid, polymethacrylic acid, a copolymer of acrylic acid or methacrylic acid and acrylic ester or methacrylic ester, etc.

The water-soluble crosslinking agent, which is used in the present invention may be any one which can crosslink or cure the water-soluble resin and form a developer-insoluble film by an acid. Examples of the water-soluble crosslinking agent include melamine derivatives, urea derivatives and so on. Among these water-soluble crosslinking agents, as examples of the melamine derivative, there are illustrated melamine, methoxy methylated melamine, methoxy ethylated melamine, propoxy methylated melamine, hexamethylol melamine and so on. As examples of the urea derivatives, there are illustrated urea, monomethylol urea, dimethylol urea, alkoxy methylene urea, N-alkoxy methylene urea, ethylene urea and so on. These water-soluble crosslinking agents can be used singly or in a combination of two or more thereof, and the formulating amount thereof is 5 to 60 parts by weight and preferably 10 to 30 parts by weight relative to 100 parts by weight of the water-soluble resin.

As a solvent, water or a mixed solution of water and a water-soluble organic solvent is applied. Water applied as a solvent is not particularly limited if it is water and one wherein organic impurities or metal ions are removed therefrom by a distillation, an ion exchange treatment, a filtration treatment, a various kind of absorption treatment, etc., pure water, for example is preferable. On the other side, as a water-soluble solvent, as long as the solvent is solved in water by 0.1% by weight or more there is no particular limit, there are illustrated by for example alcohols such as methyl alcohol, ethyl alcohol, n-propyl alcohol, isopropyl alcohol (IPA), etc.; ketones such as acetone, methylethylketone, etc.; esters such as methyl acetate, ethyl acetate, etc.; ethylene glycol monoalkylethers such as ethylene glycol monomethylether, ethylene glycol monoethylether, etc.; ethylene glycol monoalkylether acetates such as ethylene glycol monomethylether acetate, ethylene glycol monoethylether acetate, etc.; propylene glycol monoalkylethers such as propylene glycol monomethylether, propylene glycol monoethylether, etc.; propylene glycol monoalkylether acetates such as propylene glycol monomethylether acetate, propylene glycol monoethylether acetate, etc.; lactic esters such as methyl lactate, ethyl lactate, etc.; aromatic hydrocarbones such as toluene, xylene, etc.; amides such as N,N-dimethylacetoamide, N-methylpyrrolidone, etc.; lactones such as γ-butylolactone, etc.; aprotic polar solvent, etc. such as N,N-dimethyl formamide, dimethyl sulfoxide, etc. and low-class alcohols with C1 to C4 such as methyl alcohol, ethyl alcohol, iospropyl alcohol, isobutanol, aprotic polar solvent such as N,N-dimethyl formamide, dimethyl sulfoxide, etc. are illustrated as preferable ones. These solvents are applied singly or in a mixture of two or more thereof. These solvents are applied in the limit wherein, when they are made to a fine pattern forming material, said material does not solve an applied resist pattern.

The fine pattern forming material of the present invention may contain a surfactant or a leveling agent to improve a coatability and may further contain a plasticizer, etc. As a surfactant, there are illustrated an anionic surfactant such as an alkylsulfonate, an alkylbenzene sulfonic acid, an alkylbenzene sulfonate, etc.; a cationic surfactant such as laurylpyridinium, laurylmethylammonium chloride, etc.; a nonionic surfactant such as polyoxyethylene octylether, polyoxyethylene laurylether, polyoxyethylene acetylenic glycolether, etc. For example, there are illustrated Acetylenol manufactured by Kawaken Fine Chemicals Co., Ltd., Surfinol manufactured by Nisshin Chemical Industry Co., Ltd., Pionin manufactured by Takemoto Oil & Fat Co., Ltd. as a nonionic surfactant. And also there are illustrated ethylene glycol, glycerine, triethyl glycol, etc. as a plasticizer.

The fine pattern forming material of the present invention contains 1 to 30 parts by weight of a water-soluble resin, preferably 2 to 15 parts by weight, 0.1 to 10 parts by weight of a water-soluble crosslinking agent, preferably 0.1 to 5 parts by weight, 0.1 to 5 parts by weight of an amine compound, preferably 0.1 to 4 parts by weight relative to 100 parts by weight of water or a mixed solvent of water and water-soluble organic solvent.

The fine pattern forming method of the present invention applies methods so far publicly known except applying the fine pattern forming material of the present invention as fine pattern forming material and using water as a developer. Therefore a photoresist applied for forming a resist pattern and a resist pattern forming method using the resist may any one of photoresists and resist pattern forming methods so far publicly known can be applied. By the way, a resist pattern is needed to be one, which can diffuse or supply an acid by heating into a coated layer made of a fine pattern forming material. A chemical amplified positive-working photoresist is raised as a preferable one for a photoresist forming an acid-suppliable resist pattern. A coating method by a fine pattern forming material onto a resist pattern can be any one of methods so far publicly known.

A resist pattern forming method in the fine pattern forming method of the present invention is now explained by referring to FIGS. 1(a) and (b) as an example. First, as shown in FIG. 1(a), a chemically amplified positive-working radiation sensitive resin composition is applied on a substrate to be processed such as a semiconductor substrate 1, prebaked if necessary (for example, baking temperature at 70 to 150° C. and for about 1 minute) to form a photoresist layer 2. Next, after exposing to light through a photo-mask which is not illustrated in the figure, the photoresist layer is post-exposure baked (PEB), if necessary, for example, at a baking temperature of 50 to 150° C., developed, and post-development baked, if necessary, for example, at a baking temperature of 60 to 120° C., to form a positive resist pattern 3 as shown in FIG. 1 (b).

The semiconductor substrate 1 to be applied for forming a resist pattern described above may be a bare semiconductor substrate or a substrate of a silicon or the like having a silicon oxide layer, a metal layer such as aluminum, molybdenum, chromium and so on, a metal oxide layer such as ITO and so on, and a silicon layer such as polysilicon on the surface thereof, if necessary and further a substrate on which a circuit pattern or a semiconductor element is formed. The application of a chemically amplified radiation sensitive resin composition is made according to the methods so far publicly known such as a spin coating method, a roll coating method, a land coating method, a flowing and spreading coating method, a dip coating method and so on. Examples of light-exposure sources to be used include deep ultraviolet rays such as a KrF excimer laser and an ArF excimer laser, X-rays, electron beams and so on. Further, a developer for a photoresist film may be any one which can develop a chemically amplified positive-working radiation sensitive resin composition to be applied, and usually an alkali aqueous solution of tetramethyl ammonium hydroxide, sodium hydroxide or the like is used. A development method may be any one so far applied for a development of a photoresist such as a paddle method or a spray method.

And then the method will be explained by referring to FIG. 1 (c) to (e), wherein a coated layer which is crosslinked with an acid is formed on the resist pattern obtained as described above and thereby the gap between a resist pattern and a resist pattern is narrowed to form a pattern having a width below a limit resolution of a light-exposure wavelength. That is, as shown in FIG. 1 (c), the fine pattern forming material of the present invention is applied on a resist pattern 3 formed with a chemically amplified positive-working photoresist first, and baked, if necessary, for example, at a baking temperature of 65 to 85° C. for about one minute to form a coated layer 4.

Application of the fine pattern forming material may be any method so far applied when applying a radiation sensitive resin composition. These application methods are illustrated with a spin coating method, a roll coating method, a land coating method, a flowing and spreading coating method, a dip coating method and so on. Next, a bake is carried out, for example, at a baking temperature of 90 to 130° C. for about one minute in order to diffuse acids from the resist pattern 3 into the coated layer 4. Thereby acids are diffused from the resist pattern 3 to form a crosslinked and cured layer 5 in the coated layer 4 as shown in FIG. 1 (d). The coated layer 4 is developed with water for an exclusive use, the coated layer which is neither crosslinked nor cured is removed to form a pattern which is thickened by the crosslinked and cured layer 5 as shown by FIG. 1 (e), and eventually the gap between a resist pattern and a resist pattern is narrowed to form a finer pattern. The formed finer pattern is used as a resist mask for a fine processing of a substrate or resist mask for treatment such as an etching mask, an ion implantation mask and so on.

In making a resist pattern fine by the fine pattern forming material publicly known in the art, development defects easily occur particularly on a substrate having a large diameter of 6 inches or more. Accordingly, particularly preferable results can be obtained when a substrate of 6 inches or more in diameter is used as the substrate in the method of the present invention.

Hereinafter, the present invention will be described in more details by reference to the Examples, but the present invention is not limited by the Examples below.

EXAMPLE-1

(Preparation of Fine Pattern Forming Material)

100 parts by weight of polyvinyl acetal (acetylization degree: 12 mol %, acetalization degree: 30 mol %), 20 parts by weight of a water-soluble crosslinking agent of a urea derivative (methoxymethyl imidazolidinone) and 4 parts by weight of tetramethylammonium hydroxide (TMAH) were solved in 1470 parts by weight of a mixed solvent of pure water and isopropyl alcohol which is a water-soluble organic solvent (5 parts by weight of isopropyl alcohol relative to 95 parts by weight of pure water), to prepare the fine pattern forming material A (Composition A). The pH value thereof was 8.8. Next, Composition A was put into the following "Inspection for a film thickness of a coated layer" and "Inspection for development defects".

(Inspection for a Film Thickness of a Coated Layer)

AZ KrF-17B 80 (manufactured by Clariant Co. AZ is a registered trademark, the followings are the same.) was spin-coated on a 6-inch bare silicon wafer, followed by baking it at 180° C. for 60 seconds on a direct hot plate to prepare an anti-reflective coating of 0.080 µm in thickness. Further AZ DX5240P (manufactured by Clariant Co.) was spin-coated thereon, followed by baking at 90° C. for 60 seconds on a direct hotplate to form a chemically amplifiable positive-working photoresist film of 0.585 µm in thickness. This resist film was exposed to light selectively through a halftone mask by a KrF excimer laser of 248.4 nm in wave length, followed by carrying out a post-exposure baking (PEB) at 120° C. for 60 seconds on a direct hot plate. Then paddle-development was carried out using AZ 300MIF manufactured by Clariant Co. (2.38 weight-% tetramethyl ammonium hydroxide aqueous solution) as a developing solution for 60 seconds to form a hole pattern having a diameter of 0.220 µm on the silicon wafer. Composition A was spin-coated on this hole pattern and baked on a direct hot plate at 85° C. for 70 seconds to form a film of 0.350 μm in thickness. Then, after conducting a bake (mixing bake) on a direct hot plate for 70 seconds at 115° C. to promote crosslinking reaction at the interface between the resist layer and Composition A, and then developed with pure water by a running water method for 60 seconds to form a coated layer thereon. Using CD-SEM (S9220 manufactured by Hitachi High-Technologies Corporation), the diameter of the hole pattern after formation of the coated layer was measured, and the difference of the measured diameter from the diameter of the initial hole was regarded as the thickness of the coated layer. The result is shown in Table 1.

(Inspection for Development Defects)

AZ KrF-17B 80 (manufactured by Clariant Co.) was spin-coated on a bare 8-inch silicon wafer, followed by baking it at 180° C. for 60 seconds on a direct hotplate to prepare an anti-reflective coating of 0.080 μm in thickness. Further AZ DX5240P manufactured by Clariant Co. was spin-coated thereon, followed by pre-baking it at 90° C. for 60 seconds on a direct hotplate to form a resist film of 0.585 μm in thickness. The resist film was exposed to light through a binary mask selectively by KrF excimer laser of 248.4 nm in wavelength, followed by carrying out a post exposure bake (PEB) at 120° C. for 60 seconds on a direct hotplate, and paddle-developing using AZ 300MIF manufactured by Clariant Co. (a 2.38 weight-% tetramethyl-ammonium hydroxide aqueous solution) as a developing solution for 60 seconds to form a hole pattern having a diameter of 0.250 μm on the silicon wafer. Composition A was spin-coated on this hole pattern and baked at 85° C. for 70 seconds on a direct hotplate to form a film of 0.350 μm in thickness. Next, after conducting a bake (mixing bake) on a direct hotplate at 115° C. for 70 seconds in order to promote a crosslinking reaction at the interface between the resist layer and Composition A, a running water development with pure water was carried out for 60 seconds to form a coated layer. By using a surface defects inspector KLA-2115 manufactured by KLA-Tencor Co., a measurement of defects inspection after development was carried out. An evaluation of defect number after development was made by regarding as a defect after development in the case where a pattern was not developed completely and a bridge was formed over a hole pattern, and regarding the number of the total defects on a wafer as the number of defects after development. The result is shown in Table 1.

EXAMPLE-2

Except using partially methoxy carbonylated polyallylamine (PAA) represented by the general formula (2) below (n=50, m=50, average molecular weight: 3000) in place of TMAH, the same manner was carried out as Example-1 to prepare a fine pattern forming material B (Composition B). The pH value thereof was 7.3. "Inspection for a film thickness of a coated layer" and "Inspection for development defects" were carried out in the same manner as Example-1. The result is shown in Table 1.

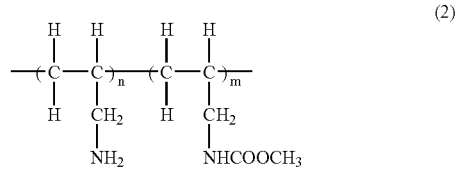
(2)

EXAMPLE-3

Except using partially methoxy carbonylated polyallylamine represented by the general formula (2) above (n=50, m=50, average molecular weight: 5000) in place of TMAH, the same manner was carried out as Example-1 to prepare a fine pattern forming material C (Composition C). The pH value thereof was 7.3. "Inspection for a film thickness of a coated layer" and "Inspection for development defects" were carried out in the same manner as Example-1. The result is shown in Table 1. Composition C was put into the following "Evaluation for coatability".

(Evaluation for Coatability)

Composition C was output on an 8-inch bare silicon wafer by 5, 7.5 and 10 cc, spin-coated at 3500 rpm and baking on a direct hotplate at 85° C. for 70 seconds to form a film of a radiation sensitive resin composition for forming a fine pattern. At this time minimum output volume was gained by observing whether or not the coating reached to an edge of the wafer evenly. The result is shown in Table-2.

EXAMPLE-4

Except using partially methoxy carbonylated polyallylamine represented by the general formula (2) above (n=50, m=50, average molecular weight: 7000) in place of TMAH, the same manner was carried out as Example-1 to prepare a fine pattern forming material D (Composition D). The pH value thereof was 7.3. "Inspection for a film thickness of a coated layer" and "Inspection for development defects" were carried out in the same manner as Example-1. The result is shown in Table 1.

EXAMPLE-5

Except using partially methoxy carbonylated polyallylamine represented by the general formula (2) above (n=70, m=30, average molecular weight: 5000) in place of TMAH, the same manner was carried out as Example-1 to prepare a fine pattern forming material E (Composition E) The pH value thereof was 7.3. "Inspection for a film thickness of a coated layer" and "Inspection for development defects" were carried out in the same manner as Example-1. The result is shown in Table 1.

EXAMPLE-6

100 parts by weight of polyvinyl acetal (acetylization degree: 12 mol %, acetalization degree: 30 mol %), 20 parts by weight of a water-soluble crosslinking agent of a urea derivative, 4 parts by weight of partially methoxy carbonylated polyallylamine represented by the general formula (2) above (n=50, m=50, average molecular weight: 5000) and 1 parts by weight of Acetylenol EL, a nonionic surfactant manufactured by Kawaken Fine Chemical Co. were solved in 1470 parts by weight of a mixed solvent of pure water and isopropyl alcohol which is a water-soluble organic solvent (5 parts by weight of isopropyl alcohol relative to 95 parts by weight of pure water), to prepare the fine pattern forming material F (Composition F). The pH value thereof was 7.3. "Inspection for a film thickness of a coated layer" and "Inspection for development defects" were carried out in the same manner as Example-1. The result is shown in Table 1. "Evaluation for coatability" was carried out in the same manner as Example-3. The result is shown in Table 2.

COMPARATIVE EXAMPLE-1

100 parts by weight of polyvinyl acetal (acetylization degree: 12 mol %, acetalization degree: 30 mol %) and 20 parts by weight of a water-soluble crosslinking agent of a urea derivative were solved in 1470 parts by weight of a mixed solvent of pure water and isopropyl alcohol which is a water-soluble organic solvent (5 parts by weight of isopropyl alcohol relative to 95 parts by weight of pure water), to prepare the fine pattern forming material G (Composition G). The pH value thereof was 4.0.

"Inspection for a film thickness of a coated layer" and "Inspection for development defects" were carried out except using AZ R2 Developer manufactured by Clariant Co. in place of pure water in the same manner as "Inspection for a film thickness of a coated layer" and "Inspection for development defects" in Example-1. The result is shown in Table 1. "Evaluation for coatability" was carried out in the same manner as Example-3. The result is shown in Table 2.

COMPARATIVE EXAMPLE-2

By using Composition G, "Inspection for a film thickness of a coated layer" and "Inspection for development defects" were carried out in the same manner as Example-1. The result is shown in Table 1.

TABLE 1

| Example | Composition | Amine compound | surfactant | developer | Film thickness* in μm | No. of defects (pieces/wafer) |
|---|---|---|---|---|---|---|
| Example1 | A | TMAH | none | water | 0.043 | 67 |
| Example2 | B | PAA: n = 50, m = 50 Mw = 3000 | none | water | 0.068 | 78 |
| Example3 | C | PAA: n = 50, m = 50 Mw = 5000 | none | water | 0.075 | 83 |
| Example4 | D | PAA: n = 50, m = 50 Mw = 7000 | none | water | 0.076 | 85 |
| Example5 | E | PAA: n = 50, m = 50 Mw = 5000 | none | water | 0.070 | 80 |
| Example6 | F | PAA: n = 50, m = 50 Mw = 5000 | contained | water | 0.079 | 80 |
| Comparative Example-1 | G | none | none | R2 | 0.078 | 85 |
| Comparative Example-2 | G | none | none | water | 0.103 | 245 |

*of the coated layer

From Table-1 in the case an amine compound is not contained in the fine pattern forming material, a pattern having less number of development defects can be formed if a developer for an exclusive use is applied, however a number of development defects increased remarkably by a water development. And in the case developing a composition having no amine compound the film thickness of the coated layer came to be thick. However, the number of defects was small even after a water development in the case of the fine pattern forming material containing an amine compound and the film thickness of the coated layer thereof showed a comparative thickness as that when a fine pattern forming material is developed with a developer for an exclusive use. From the above it proves that by incorporating an amine compound into a fine pattern forming material, the crosslinked or cured coated layer can be obtained, wherein the solubility of an uncrosslinked area is improved, the number of defects after development comes to be small even by a water development, the film thickness thereof comes to thin and stable. And it also proves that there is no influence on film thickness of a coated layer and the number of defects after development by addition of a surfactant.

TABLE 2

| Example | Composition | Amine compound | Surfactant | Output of composition(CC) 5 | 7.5 | 10 |
|---|---|---|---|---|---|---|
| Example-3 | C | PAA: n = 50, m = 50 Mw = 5000 | None | X | ○ | ○ |
| Example-6 | F | PAA: n = 50, m = 50 Mw = 5000 | contained | ○ | ○ | ○ |
| Comparative Example-1 | G | none | none | X | ○ | ○ |

In Table-2, ○ and X represent the following results.
○: A pattern forming material could be applied evenly on an 8-inch wafer.
X: Coating unevenness of a pattern forming material was observed on the edge area of an 8-inch wafer.

From Table-2, whole area of an 8-inch wafer was coated evenly with output volume of 5 cc in case of Composition F containing a surfactant, amount of 7.5 cc was required to coat the whole area of an 8-inch wafer evenly in case of Composition C, G. Accordingly it proves that a minimum coating amount which requires to coat an 8-inch wafer evenly is reduced by incorporating a surfactant into a fine pattern forming material.

What is claimed is:

1. A fine pattern forming material comprising a water-soluble resin, a water-soluble crosslinking agent, a solvent consisting of water or a mixed solvent of water and a water-soluble organic solvent, and an amine compound which is at least one selected from the group of a polyallylamine derivative, and that pH value of the fine pattern forming material exceeds 7.0, further where the amino group of the polyallylamine is partially protected at least by one selected from the group of an alkyloxycarbonyl group, an aryloxycarbonyl group and an alkylcarbonyl group.

2. The fine pattern forming material according to claim 1 wherein the water-soluble resin is at least one selected from a group of a polyvinylaicohol derivative, a polyvinylpyrrolidone derivative and a polyacrylic acid derivative.

3. The fine pattern forming material according to claim 1, wherein the above amine compound is a polyallylamine derivative having the molecular weight of 1,000 to 10,000.

4. The fine pattern forming material according to claim 1 further comprising a surfactant selected from an anionic surfactant and a nonionic surfactant and laurylpyridinium chloride.

5. The fine pattern forming materiel according to claim 4, wherein the above surfactant is at least one selected from the group of an anionic surfactant selected from a group of alkylsulfonate, alkylbenzene sulfonic acid and alkylbenzenesulfonate, and a nonionic surfactant selected from a group of polyoxyethylene octylether, polyoxyethylene laurylether and polyoxyethylene acetylenic glycolether.

6. A fine pattern forming method comprising a step of forming a resist pattern made of a photoresist on a substrate, a step wherein a coating layer is formed by applying the fine pattern forming material of claim 1 over the resist pattern, a step wherein the area neighboring to the resist pattern is crosslinked and/or cured by heating the resist pattern and the coated layer by a diffusion of an acid from the resist pattern, and a step wherein the coated layer is developed by water or a mixture of water and a water-soluble organic solvent after heating.

7. The tine pattern forming material according to claim 1 where water-soluble crosslinking agent is at least one selected from the group consisting of a melamine derivative and a urea derivative.

8. The fine pattern forming material according to claim 1 where organic solvent is at least one selected from a group of alcohols, ketones, esters, ethylene glycol monoalkylethers, ethylene glycol monoalkylether acetates, propylene glycol monoalkylethers, propylene glycol monoalkylether acetates, lactic esters, aromatic hydrocarbons, amides, lactones, aprotic polar solvents.

9. The fine pattern forming material according to claim 1, further comprising a plasticizer.

10. The fine pattern forming material according to claim 4, further comprising a plasticizer.

11. The method of claim 6, where the curing temperature is in the range of about 90° C. to about 130° C.

12. The fine pattern forming material according to claim 4, wherein the above surfactant is laurylpyridinium chloride.

* * * * *